United States Patent
Sung et al.

(10) Patent No.: US 7,781,333 B2
(45) Date of Patent: Aug. 24, 2010

(54) SEMICONDUCTOR DEVICE WITH GATE STRUCTURE AND METHOD FOR FABRICATING THE SEMICONDUCTOR DEVICE

(75) Inventors: Min-Gyu Sung, Ichon-shi (KR); Hong-Seon Yang, Ichon-shi (KR); Heung-Jae Cho, Ichon-shi (KR); Yong-Soo Kim, Ichon-shi (KR); Kwan-Yong Lim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 455 days.

(21) Appl. No.: 11/765,546

(22) Filed: Jun. 20, 2007

(65) Prior Publication Data

US 2008/0157205 A1 Jul. 3, 2008

(30) Foreign Application Priority Data

Dec. 27, 2006 (KR) .................. 10-2006-0134368
Apr. 27, 2007 (KR) .................. 10-2007-0041289

(51) Int. Cl.
*H01L 21/4763* (2006.01)

(52) U.S. Cl. .................. 438/643; 438/627; 438/648; 438/653; 257/751; 257/E21.584

(58) Field of Classification Search .................. 438/643, 438/627, 648, 653; 257/751, E21.584
See application file for complete search history.

(56) References Cited

U.S. PATENT DOCUMENTS

| | | | |
|---|---|---|---|
| 5,719,410 A | 2/1998 | Suehiro et al. | |
| 5,796,151 A | 8/1998 | Hsu et al. | |
| 5,925,918 A | 7/1999 | Wu et al. | |
| 5,998,290 A | 12/1999 | Wu et al. | |
| 6,075,274 A | 6/2000 | Wu et al. | |
| 6,107,171 A | 8/2000 | Tsai | |
| 6,271,590 B1 * | 8/2001 | Akram et al. | 257/748 |
| 6,306,743 B1 | 10/2001 | Lee | |
| 6,333,250 B1 | 12/2001 | Kim | |
| 6,744,108 B1 | 6/2004 | Pan | |

(Continued)

FOREIGN PATENT DOCUMENTS

CN 1819153 8/2006

(Continued)

OTHER PUBLICATIONS

Lim et al., "W/WSiN/WSix/poly-Si gate technology for high performance DRAM devices," *SEMICON*, Korea STS, pp. 169-171 (2006).

(Continued)

*Primary Examiner*—Mary Wilczewski
*Assistant Examiner*—Telly D Green
(74) *Attorney, Agent, or Firm*—Townsend and Townsend and Crew LLP

(57) ABSTRACT

A gate structure of a semiconductor device includes an intermediate structure, wherein the intermediate structure includes a titanium layer and a tungsten silicide layer. A method for forming a gate structure of a semiconductor device includes forming a polysilicon-based electrode. An intermediate structure, which includes a titanium layer and a tungsten silicide layer, is formed over the polysilicon-based electrode. A metal electrode is formed over the intermediate structure.

16 Claims, 8 Drawing Sheets

U.S. PATENT DOCUMENTS

| | | | |
|---|---|---|---|
| 6,872,639 B2 | 3/2005 | DeBoer et al. | |
| 6,875,679 B2 | 4/2005 | Agarwal | |
| 6,911,381 B2 | 6/2005 | Agarwal et al. | |
| 6,943,416 B2 | 9/2005 | Hu | |
| 7,666,785 B2* | 2/2010 | Sung et al. | 438/643 |
| 2001/0054729 A1 | 12/2001 | Divakaruni et al. | |
| 2002/0072156 A1 | 6/2002 | Lee et al. | |
| 2004/0207030 A1 | 10/2004 | McTeer | |
| 2005/0074957 A1 | 4/2005 | Ho et al. | |
| 2005/0124127 A1 | 6/2005 | Ho et al. | |
| 2006/0244084 A1 | 11/2006 | Lee et al. | |
| 2007/0001246 A1* | 1/2007 | Lim et al. | 257/412 |

FOREIGN PATENT DOCUMENTS

| | | |
|---|---|---|
| KR | 1020000009254 A | 2/2000 |
| KR | 100662850 B1 | 12/2006 |
| KR | 1020070002558 A | 1/2007 |

OTHER PUBLICATIONS

Lim et al., "Highly Reliable and Scalable Tungsten Polymetal Gate Process for Memory Devices using Low-Temperature Plasma Selective Gate Reoxidation," *Symposium on VLSI Technology Digest of Technical Papers* (2006).

Lim et al., "Limitation of WSix/WN Diffusion Barrier for Tungsten Dual Polymetal Gate Memory Devices," *IEEE 45$^{th}$ Annual International Reliability Physics Symposium*, Phoenix (2007).

Lim et al., "Impact of Thin WSix Insertion in Tungsten Polymetal Gate on Gate Oxide Reliability and Gate Contact Resistance," *IEEE 44$^{th}$ Annual International Reliability Physics Symposium*, San Jose (2006).

Sung, "Diffusion Barrier Characteristics of TiSix/TiN for Tungsten Dual Poly Gate in DRAM," *Extended Abstracts of the 2006 International Conference on Solid State Devices and Materials*, Yokohama, pp. 136-137 (2006).

Sung et al., "Thin WSix insertion in tungsten gate stacks," *EuroAsia Semiconductor Magazine* pp. 45-49 (Sep. 2006).

Sung et al., "Roles of Ti, TiN, and WN as an Interdiffusion Barrier for Tungsten Dual Polygate Stack in Memory Devices," *Japanese Journal of Applied Physics* 46:2134-2138 (2007).

Sung et al., "Gate Oxide Reliability Characterization of Tungsten Polymetal Gate with Low-Contact-Resistive WSi$_x$/WN Diffusion Barrier in Memory Devices," *Japanese Journal of Applied Physics* 46:7256-7262 (2007).

* cited by examiner

SEMICONDUCTOR DEVICE WITH GATE STRUCTURE AND METHOD FOR FABRICATING THE SEMICONDUCTOR DEVICE

CROSS-REFERENCE TO RELATED APPLICATIONS

The present invention claims priority of Korean patent application numbers 10-2006-0134368 and 10-2007-0041289, respectively filed on Dec. 27, 2006 and Apr. 27, 2007, which are incorporated by reference in their entirety.

BACKGROUND OF THE INVENTION

The present invention relates to a semiconductor device, and more particularly, to a gate structure and a method for fabricating the gate structure.

In general, as complementary metal-oxide semiconductor (CMOS) devices have become highly integrated, gate pitch has decreased. Certain limitations exist when gate electrodes and gate insulation layers are formed using conventional CMOS process and materials. For this reason, it is desirable to develop new materials that can replace the conventional materials.

In the conventional CMOS process, a polysilicon layer doped with an N-type impurity is used to form gates of N-channel metal-oxide semiconductor (NMOS) and P-channel metal-oxide semiconductor (PMOS) devices. Thus, NMOS devices commonly show surface channel characteristics, while PMOS devices commonly show buried channel characteristics. Due to the buried channel characteristics, PMOS devices are prone to a short channel effect when widths of gates are reduced to a certain level (e.g., 100 nm or less).

In one attempt to overcome the above limitation in fabricating a CMOS device with a short channel length, a dual polysilicon gate structure is suggested by forming gate electrodes of NMOS devices and PMOS devices using N-type impurity-doped polysilicon and P-type impurity-doped polysilicon, respectively. In particular, the dual polysilicon gate structure allows the PMOS devices to have surface channel characteristics, while helping to prevent the short channel effect.

FIG. 1 illustrates a simplified view of a conventional dual polysilicon gate structure. A gate oxide layer 12 is formed on a substrate 11 including PMOS and NMOS regions. The gate oxide layer 12 is formed of silicon oxynitride (SiON). In the NMOS region, a gate structure including a polysilicon layer 13A and a metal electrode 14 is formed on the gate oxide layer 12. The polysilicon layer 13A is highly doped with an N$^+$-type impurity such as phosphorus (P). In the PMOS region, another gate structure including another polysilicon layer 13B and the metal electrode 14 is formed on the gate oxide layer 12. The polysilicon layer 13B is highly doped with a P$^+$-type impurity such as boron (B).

However, the dual polysilicon gate structure illustrated in FIG. 1 has several limitations. For instance, boron doped onto the P$^+$-type polysilicon layer 13B usually penetrates into the channel region in the PMOS region, and this event is likely to cause the threshold voltage to fluctuate. Reference numeral 15A denotes this penetration event. Also, boron doped onto the P$^+$-type polysilicon layer 13B may diffuse out toward the metal electrode 14 as reference numeral 15B illustrates. This out-diffusion of boron may result in a polysilicon depletion effect (PDE), which may degrade the characteristics of the device. Nitriding the surface of the gate oxide layer 12 may reduce the effects associated with the boron penetration 15A into the channel region. However, an effective method that can prevent the PDE has not yet been introduced.

FIG. 2 illustrates a graph of gate voltage versus capacitance of PMOS and NMOS devices in the conventional dual polysilicon gate structure. More specifically, FIG. 2 shows the comparative results of the inversion capacitance of the PMOS and NMOS devices.

Due to the PDE resulting from the boron diffusing out toward the metal electrode 14, the capacitance of the PMOS device is less than that of the NMOS device. This result means that the capacitance effective thickness of the gate oxide layer 12 increases. In such a case, a sub-100 nm gate structure may have a large fluctuation in threshold voltage, and thus, device characteristics are likely to be degraded.

The conventional gate structure may have the following disadvantages. Metal electrodes in the polysilicon gates of memory devices such as dynamic random access memories (DRAMs) are generally formed of tungsten silicide (WSi). However, tungsten (W) receives more attention than WSi as a material for gate electrodes when high operation speeds are desired. Gate structures in CMOS devices using W are often called W-dual polysilicon gate structures.

However, for a gate structure including W and polysilicon, which are in direct contact, a reaction that produces tungsten silicide may occur during the thermal treatment. Thus, a volume expansion, which often leads to a stress reaction, may be observed. Consequently, an additional structure that can function as a diffusion barrier is generally required between the tungsten and polysilicon of the gate structure.

SUMMARY OF THE INVENTION

Specific embodiments of the present invention are directed toward providing a gate structure with an intermediate structure, which can provide the gate structure with low contact resistance and low sheet resistance, and a method for fabricating the same. Although the present invention has been illustrated using gate structures formed entirely above a substrate, the present invention may be implemented in other types of devices, e.g., a device having a recess gate that is formed at least partly within the substrate.

In accordance with one aspect of the present invention, a gate structure of a semiconductor device includes an intermediate structure, wherein the intermediate structure comprises a titanium layer and a tungsten silicide layer.

In accordance with another aspect of the present invention, a method for forming a gate structure of a semiconductor device includes forming a first electrode; forming an intermediate structure over the first electrode, the intermediate structure comprising a titanium layer and a tungsten silicide layer; and forming a second electrode over the intermediate structure.

In one embodiment, a semiconductor device includes a substrate having an upper surface and a lower surface; a gate structure provided proximate to the upper surface of the substrate. The gate structure comprises a gate insulation layer, a first electrode over the gate insulation layer, an intermediate structure over the first electrode, and a second electrode over the intermediate structure. The intermediate structure comprises a first Ti layer including titanium and a second W layer including tungsten and silicon, and being provided over the first Ti layer. The first Ti layer is a titanium silicide (TiSi$_x$) layer, where x is approximately 2. The second W layer is a tungsten silicide layer. The intermediate structure comprises a second Ti layer including titanium nitride, and being provided over the first Ti layer; and a first W layer provided between the second Ti layer and the second W layer, the first W layer including tungsten.

In another embodiment, the first Ti layer, the second Ti layer, and the first W layer are derived from a thermal treatment of a titanium layer and a tungsten nitride layer. The titanium layer is formed to a thickness of approximately 50 Å or less.

In another embodiment, the device further includes a third Ti layer provided between the first W layer and the second w layer, the third Ti layer including titanium nitride. A third W layer is provided over the second W layer and includes tungsten silicon nitride. The tungsten silicon nitride is derived from a thermal treatment of a tungsten silicide layer and a tungsten nitride layer. The tungsten silicide layer is an amorphous tungsten silicide ($WSi_x$) layer, where x ranges between approximately 2 and 5.

In another embodiment, a method for forming a gate structure of a semiconductor device includes forming a first electrode proximate to an upper surface of a substrate; forming an intermediate structure over the first electrode, the intermediate structure comprising a titanium layer and a tungsten silicide layer; and forming a second electrode over the intermediate structure. Forming the intermediate structure comprises forming the titanium layer, a first tungsten nitride layer and a titanium nitride layer over the first electrode; and forming the tungsten silicide layer and a second tungsten nitride layer over the titanium nitride layer. The titanium layer, the first tungsten nitride layer, the titanium nitride layer, the tungsten silicide layer, and the second tungsten nitride layer are thermally treated to obtain a titanium silicide layer over the polysilicon layer, a first titanium nitride layer over the titanium silicide layer, a tungsten layer over the first titanium nitride layer, a second titanium nitride layer over the tungsten layer, a tungsten silicide layer over the second titanium nitride layer, and a tungsten silicon nitride layer over the tungsten silicide layer.

DESCRIPTION OF SPECIFIC EMBODIMENTS

Figure 1:
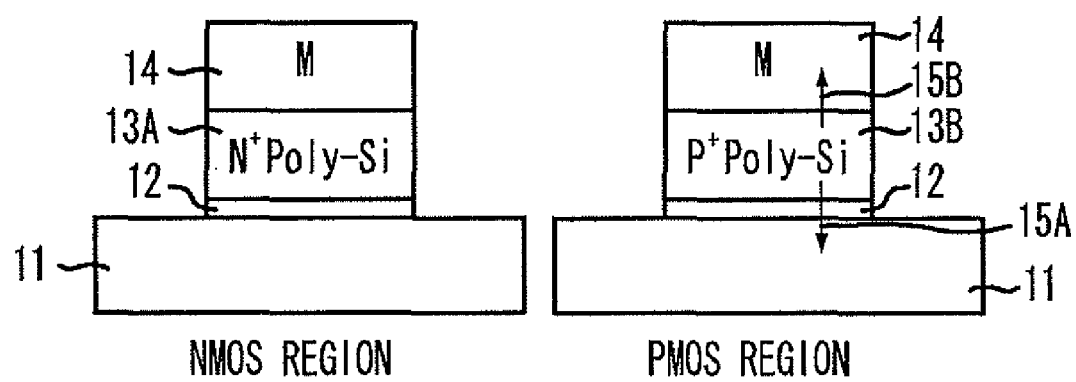
FIG. 1 illustrates a simplified view of a conventional dual polysilicon gate structure.
Figure 2:
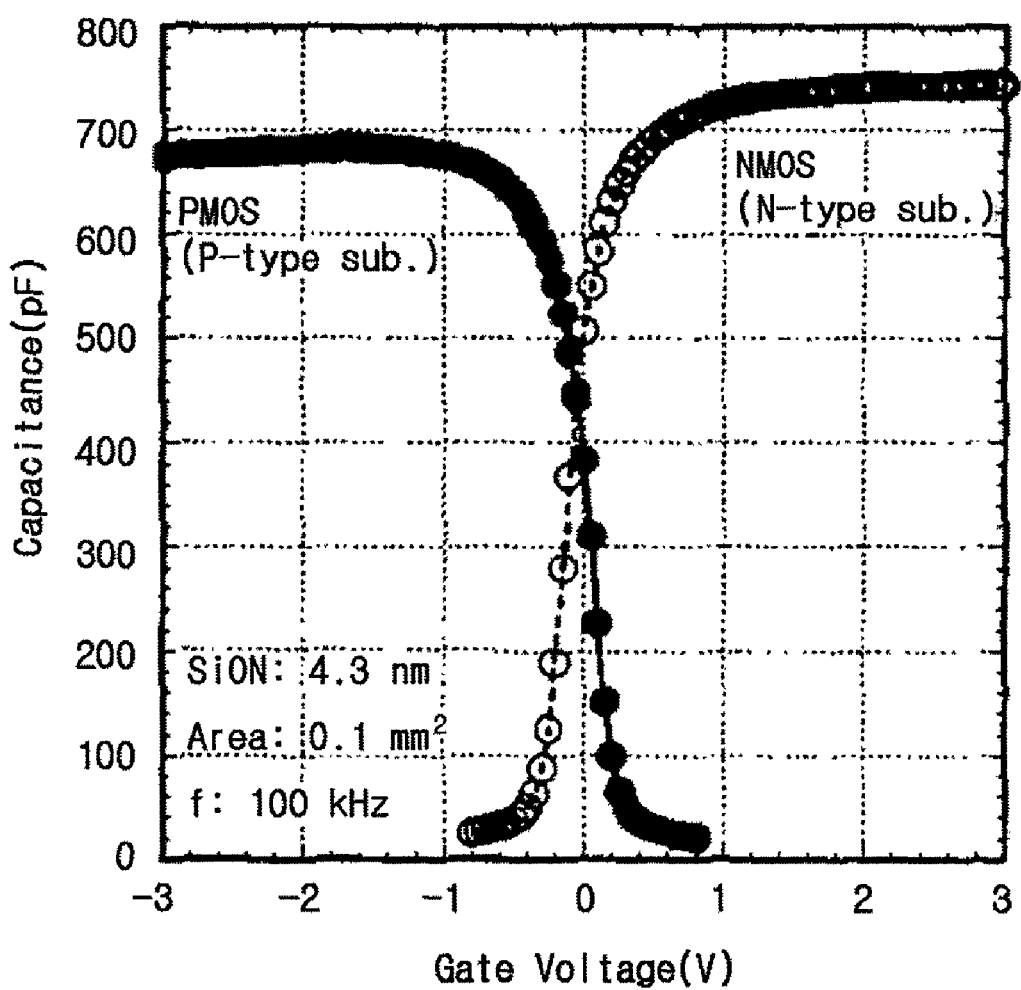
FIG. 2 is a graph of gate voltage versus capacitance of PMOS and NMOS devices in the conventional dual polysilicon gate structure.
Figure 3A:
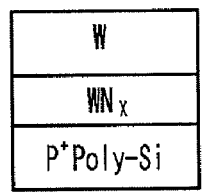
FIGS. 3A to 3C illustrate gate structures in PMOS devices each including an intermediate structure.
Figure 3B:
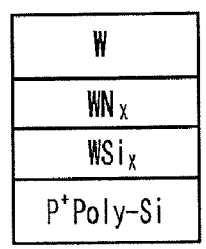
Figure 3C:
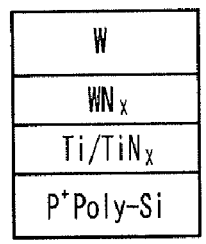

FIGS. 3A to 3C illustrate gate structures for PMOS devices each including a specific intermediate structure. FIG. 3A illustrates a gate structure with a single layer including tungsten nitride ($WN_x$). FIG. 3B illustrates a gate structure with double layers including $WSi_x$ and $WN_x$. FIG. 3C illustrates a gate structure with triple layers including titanium (Ti), titanium nitride ($TiN_x$), and $WN_x$. Herein, x representing a corresponding atomic ratio is a positive number. In FIGS. 3A to 3C, each of the gate structures includes an electrode formed of $P^+$-type impurity doped polysilicon, and a metal electrode formed of W.

The gate structures of the PMOS devices with different intermediate structures show different characteristics. For the intermediate structure including a single layer as illustrated in FIG. 3A, a Si—N dielectric layer is likely to be formed on the interface of the polysilicon electrode. Thus, the contact resistance of the gate structure increases. Consequently, another layer may be necessary.

Referring to FIGS. 3B and 3C, the illustrated double and triple-layer intermediate structures each include a $WN_x$ layer underneath the W electrode, so that the reaction that produces $WSi_x$ can be suppressed. However, in the triple-layer intermediate structure, due to the reaction that produces titanium silicide ($TiSi_x$), where x is a positive number, the Ti layer contributes to an improvement in the contact resistance of the gate structure (i.e., low contact resistance). However, the sheet resistance of the W electrode usually increases. The reason for the increase in the sheet resistance is that the $WN_x$ layer is formed in a crystalline state on the Ti and $TiN_x$ layers. Therefore, the sheet resistance of the W electrode formed on the $WN_x$ layer is likely to increase.

In the double-layer intermediate structure, the sheet resistance of the W electrode is usually low, while the contact resistance of the gate structure is usually high. The reason for the low sheet resistance is that the $WN_x$ layer is formed on the $WSi_x$ layer which is in an amorphous state, and the W electrode is formed on the $WN_x$ layer. Specifically, there is a trade-off between the contact resistance of the gate structure and the sheet resistance of the W electrode.

Figure 3D:
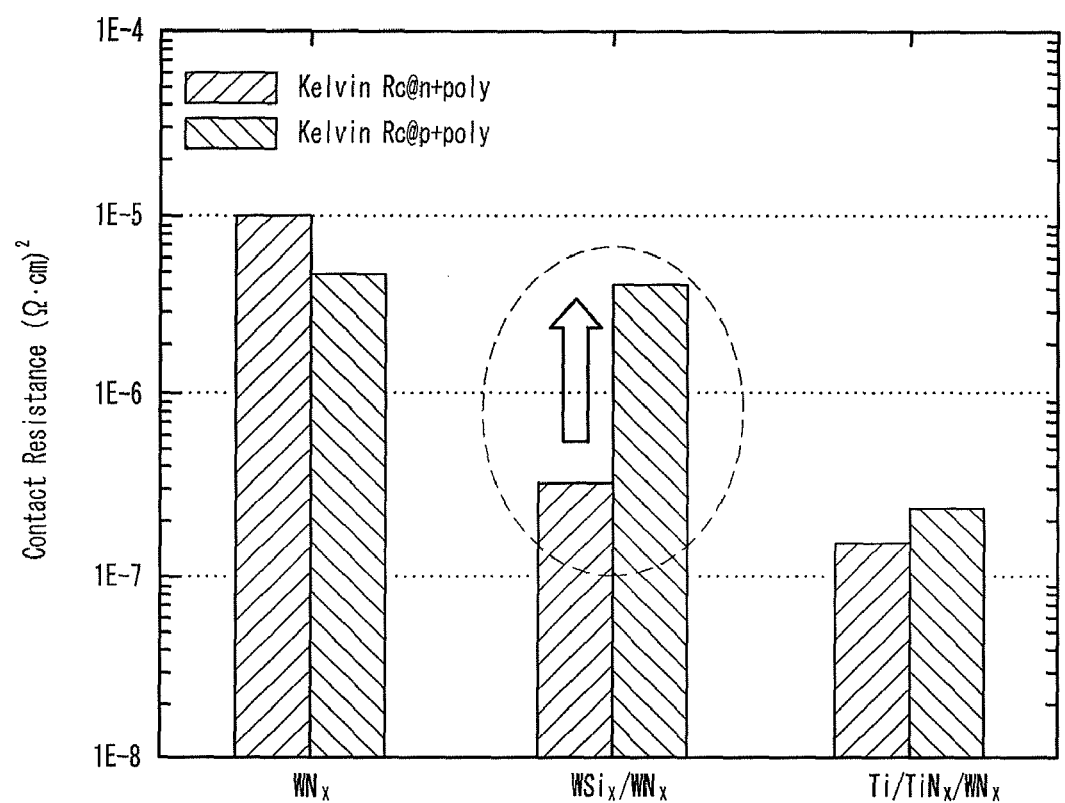
FIG. 3D is a graph illustrating different levels of contact resistance for each type of intermediate structures.
Figure 3E:
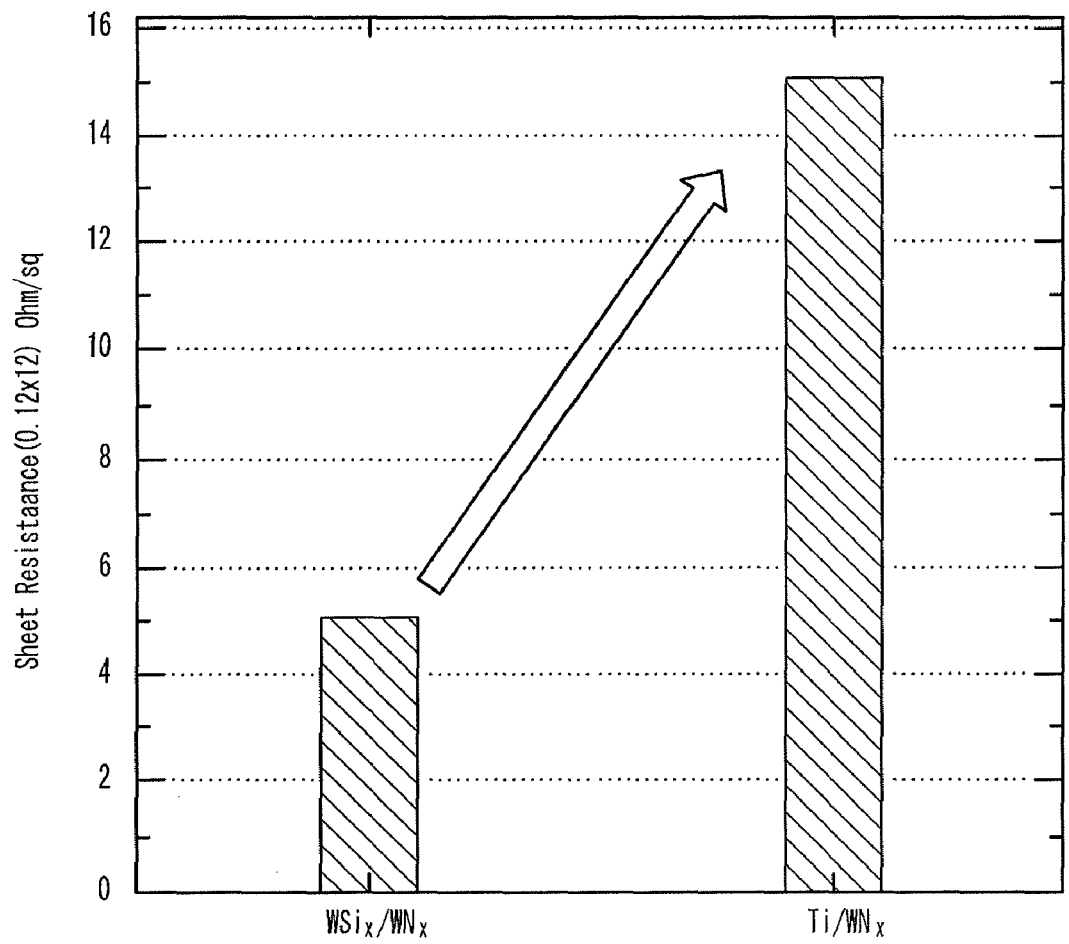
FIG. 3E is a graph illustrating different levels of sheet resistance for each type of intermediate structures.

FIG. 3D is a graph illustrating different levels of contact resistance for each type of intermediate structures. FIG. 3E is a graph illustrating different levels of sheet resistance for each type of intermediate structures. Reference letter Rc in FIG. 3D represents the contact resistance.

The $WN_x$ intermediate structure, the $WSi_x/WN_x$ intermediate structure, and the $Ti/TiN_x/WN_x$ intermediate structure may not obtain acceptable sheet resistance and contact resistance during processes of forming a dual polysilicon gate structure. The $WN_x$ intermediate structure may have high contact resistance and low sheet resistance in the PMOS and NMOS devices. The $WSi_x/WN_x$ intermediate structure may have low contact resistance in the NMOS device, and high contact resistance in the PMOS device. The sheet resistance of the $WSi_x/WN_x$ intermediate structure may be low. The $Ti/TiN_x/WN_x$ intermediate structure may have low contact resistance and high sheet resistance in the NMOS and PMOS devices.

According to embodiments of the present invention, a gate structure includes an intermediate structure that can provide the gate structure with low contact resistance and low sheet resistance. The intermediate structure is formed in a gate structure that can obtain low contact resistance usually observed when a $Ti/TiN_x/WN_x$ intermediate structure is used and low sheet resistance usually observed when a $WSi_x/WN_x$ intermediate structure is used.

The $Ti/TiN_x/WN_x$ intermediate structure provides low contact resistance because $TiSi_x$, where x is a positive number, is formed by a reaction between the polysilicon electrode and the Ti layer of the $Ti/TiN_x/WN_x$ intermediate structure. The titanium silicide ($TiSi_x$) provides an ohmic contact. The $WSi_x/WN_x$ intermediate structure provides low sheet resistance because the amorphous $WN_x$ layer is formed over an amorphous $WSi_x$ layer. The sheet resistance is high when the $Ti/TiN_x/WN_x$ intermediate structure is used because the W electrode is formed over the crystallized $WN_x$ layer, which is deposited on the crystallized Ti or $TiN_x$ layer. In the case of the $WSi_x/WN_x$ intermediate structure, the contact resistance is high because of the boron-nitrogen (B—N) interaction at the interface between the $WN_x$ layer and the $WSi_x$ layer.

Therefore, the gate structure according to embodiments of the present invention is formed with a structure that can obtain low contact resistance of the gate structure due to the Ti layer of the $Ti/TiN_x/WN_x$ intermediate structure and low sheet resistance of the gate structure due to the $WSi_x$ layer of the $WSi_x/WN_x$ intermediate structure. Such an intermediate structure includes at least Ti and $WSi_x$ layers. Although described later in detail, one exemplary intermediate structure includes Ti, TiN, $WSi_x$, and $WN_x$ layers. In the case of a $Ti/TiN/WSi_x/WN_x$ intermediate structure, a gate structure in an NMOS region of a substrate may have an abnormal interface. Thus, one embodied intermediate structure is designed to allow a simultaneous decrease in contact resistance and sheet resistance of the gate structure without forming the abnormal interface.

Figure 4:
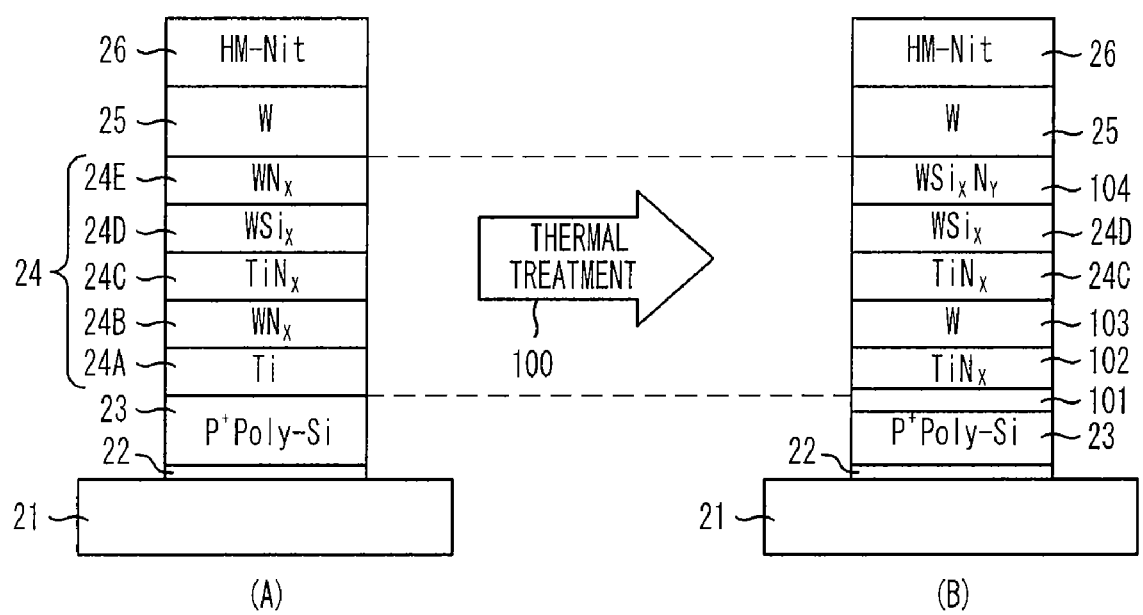
FIG. 4 illustrates a gate structure before and after applying a thermal treatment to the gate structure in accordance with an embodiment of the present invention.

FIG. 4 illustrates a gate structure before and after applying a thermal treatment to the gate structure in accordance with an embodiment of the present invention. Particularly, the gate structure before applying the thermal treatment is illustrated in (A) of FIG. 4, while the gate structure after applying the thermal treatment is illustrated in (B) of FIG. 4.

Referring to (A) of FIG. 4, a gate insulation layer 22 is formed over a substrate 21. The gate insulation layer 22 includes an oxide-based material such as SiON. A first electrode 23 is formed over the gate insulation layer 22. The first electrode 23 includes a polysilicon-based material, which is highly doped with a $P^+$-type impurity (e.g., boron). The first electrode 23 may be of or include other materials according to implementations.

An intermediate structure 24 is formed over the first electrode 23. The intermediate structure 24 includes a Ti layer 24A, a first $WN_x$ layer 24B, a $TiN_x$ layer 24C, a $WSi_x$ layer 24D, and a second $WN_x$ layer 24E. Herein, x representing a corresponding atomic ratio is a positive number. In particular, x in the $WSi_x$ layer 24D may range between approximately 2 and 5 (more specifically, between approximately 2 and 3). Also, the $WSi_x$ layer is in an amorphous state. The intermediate structure 24 is formed by performing a chemical vapor deposition (CVD) method, an atomic layer deposition (ALD) method, or a physical vapor deposition (PVD) method. For instance, the $WSi_x$ layer 24D is formed by a CVD or PVD method, and the Ti layer 24A, the first $WN_x$ layer 24B, the $TiN_x$ layer 24C, and the second $WN_x$ layer 24E are formed by a PVD method. The Ti layer 24A is formed to a thickness of approximately 50 Å or less (e.g., in a range of approximately 5 Å to 30 Å), and the $TiN_x$ layer 24C is formed to a thickness of approximately 20 Å or more (e.g., in a range of approximately 40 Å to 200 Å). The first and second $WN_x$ layers 24B and 24E each are formed to a thickness ranging from approximately 50 Å to 100 Å. The content of nitrogen in each of the first and second $WN_x$ layers ranges approximately 10% to 50%, and more particularly, approximately 30%. The $WSi_x$ layer 24D is formed to a thickness ranging from approximately 40 Å to 100 Å.

A second electrode 25 is formed over the intermediate structure 24. The second electrode 25 includes a metal (e.g., W). A gate hard mask 26 is formed over the second electrode 25. The gate hard mask includes a nitride-based material. The gate hard mask may be of or include different materials according to implementations.

The intermediate structure 24 will be described in more detail. The Ti layer 24A reacts with the first electrode 23 (i.e. $P^+$-type impurity doped polysilicon electrode) to form a $TiSi_x$ layer during a subsequent thermal treatment 100. In the $TiSi_x$ layer, x is a positive number, and more particularly, x is approximately 2 in the present embodiment. As a result, this reaction contributes to achieving a more ideal ohmic contact.

The first $WN_x$ layer 24B and the $TiN_x$ layer 24C are formed to prevent an excessive silicide reaction between the $WSi_x$ layer 24D and the Ti layer 24A. For instance, the $TiSi_x$ layer is formed by the reaction between the Ti layer 24A and the first electrode 23 (e.g., $P^+$-type impurity doped polysilicon electrode). The first $WN_x$ layer 24B and the $TiN_x$ layer 24C help in preventing an excessive silicide reaction between the $TiSi_x$ layer and the $WSi_x$ layer 24D. In particular, the first $WN_x$ layer 24B allows formation of $TiN_x$ through a reaction between nitrogen of the $WN_x$ layer 24B and titanium of the Ti layer 24A during the subsequent thermal treatment 100. The resulting $TiN_x$ layer 102 prevents out-diffusion of silicon and boron.

The $TiN_x$ layer 24C of the intermediate structure 24 prevents the out-diffusion of boron during the subsequent thermal treatment 100. Thus, it is possible to prevent formation of a boron-nitrogen (B—N) layer over an interface between the second $WN_x$ layer 24E and the $WSi_x$ layer 24D. This effect can be enhanced by increasing the thickness of the TiN layer 24C. The $WSi_x$ layer 24D is formed to reduce the sheet resistance of the second electrode 25.

The contact resistance of the gate structure can be reduced since the intermediate structure 24 includes the $TiN_x$ layer 24C, which can prevent the out-diffusion of the dopant boron within the first electrode 23. The second $WN_x$ layer 24E and the second electrode 25 formed over the $WSi_x$ layer 24D allows the reduction of the sheet resistance.

Also, the first $WN_x$ layer 24B and the $TiN_x$ layer 24C of the intermediate structure 24 prevent the out-diffusion of boron and silicon in the first electrode 23 (i.e., the $P^+$-type impurity doped polysilicon electrode). For instance, if the $TiN_x$ layer 24C exists without the first $WN_x$ layer 24B, the $TiN_x$ layer 24C may not effectively prevent the diffusion of silicon within the first electrode 23 (i.e., the P+-type impurity doped polysilicon electrode) during the subsequent thermal treatment 100. Thus, an excessive silicide reaction may take place over the aforementioned interface. The excessive silicide reaction usually takes place because a reaction that produces $TiSi_x$ at low temperature stimulates the diffusion of silicon upward during the subsequent thermal treatment 100.

The intermediate structure 24 is formed by combining the advantages of the $WSi_x$ diffusion layer and the advantages of the Ti layer. Hence, even if the thermal treatment 100 is applied, the interfacial silicide reaction is not likely to occur, so that the contact resistance and sheet resistance of the gate structure can be reduced.

As illustrated in FIG. 4(B), the intermediate structure 24 (see FIG. 4(A)) is transformed after the thermal treatment 100. The thermal treatment 100 is performed at approximately 900° C. After the thermal treatment 100, a structure including a $TiSi_x$ layer 101, another $TiN_x$ layer 102, and a W layer 103 is formed between the electrode 23 and the $TiN_x$ layer 24C. A tungsten silicon nitride ($W_xSi_yN_z$) layer 104, where x, y and z are positive numbers, is formed between the $WSi_x$ layer 24D and the second electrode 25. The thermal treatment 100 may not cause a substantial change in the thickness of the intermediate structure 24. Although the thickness of the $WSi_x$ layer 24D increases due to the interfacial reaction with the second $WN_x$ layer 24E to form the $W_xSi_yN_z$ layer 104 during the thermal treatment 100, the aforementioned thicknesses of the individual layers of the intermediate structure 24 before the thermal treatment 100 are substantially the same as those after the thermal treatment 100. Also, the thickness of the TiSi$_x$ layer 101 is small enough not to cause agglomeration.

In detail, the TiSi$_x$ layer 101 is formed over the first electrode 23 through a reaction between silicon from the first electrode 23 and Ti from the Ti layer 24A. The other TiN$_x$ layer 102 is formed through a reaction between Ti from the Ti layer 24A and nitrogen from the first WN$_x$ layer 24B. Tungsten (W) in the W layer 103 is residual W when N provided from the first WN$_x$ layer 24B is separated during the formation of the other TiN$_x$ layer 102. As mentioned above, the TiSi$_x$ layer 101, which is formed through the reaction between the first electrode 23 and the Ti layer 24A, can improve the characteristics of the ohmic contact. The W$_x$Si$_y$N$_z$ layer 104 is formed through a reaction between the WSi$_x$ layer 24D and the second WN$_x$ layer 24E.

Figure 5A:
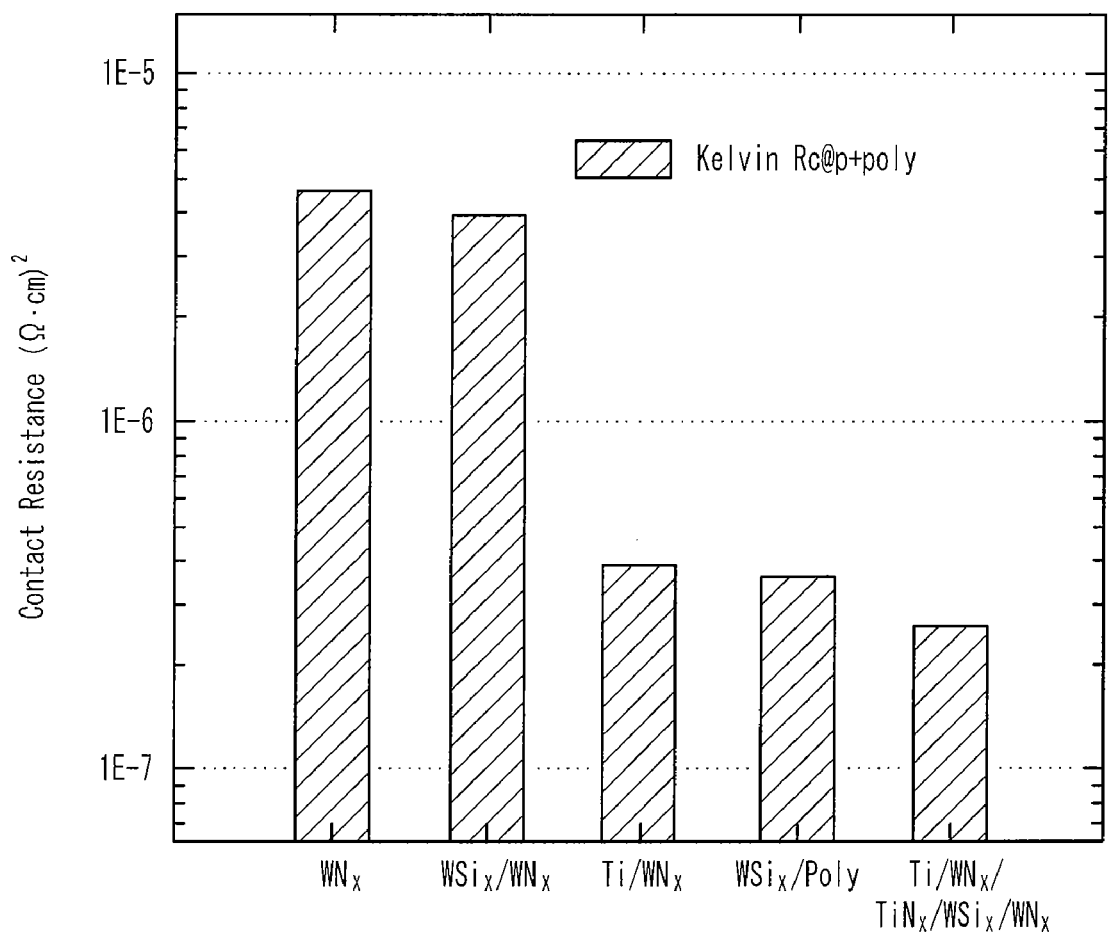
FIG. 5A is a graph illustrating different levels of interfacial resistance (i.e., contact resistance) between tungsten and polysilicon for each type of intermediate structures.
Figure 5B:
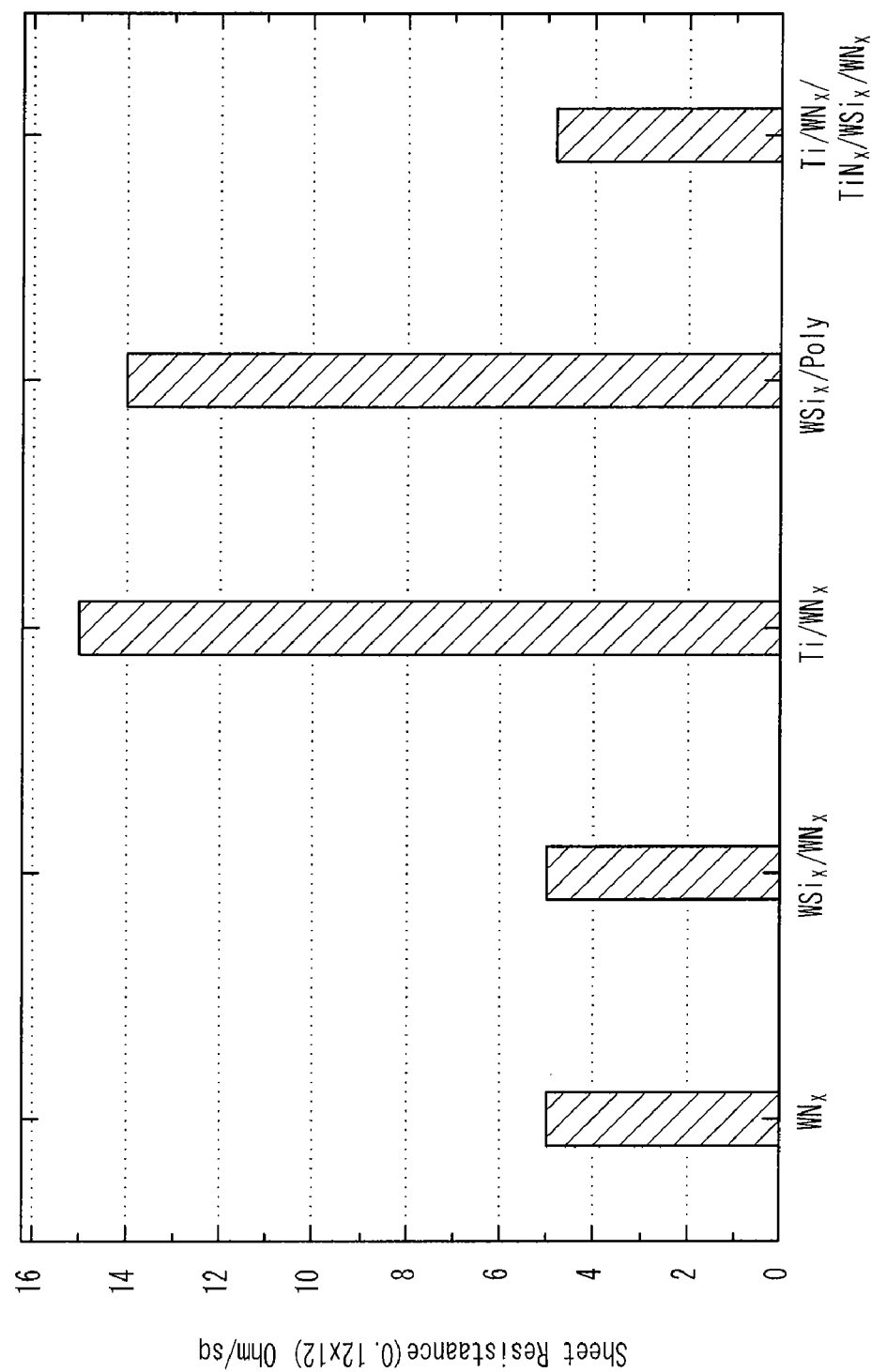
FIG. 5B is a graph illustrating different levels of sheet resistance for each type of intermediate structures.

FIG. 5A is a graph illustrating different levels of interfacial resistance (i.e., contact resistance) between tungsten and polysilicon for each type of intermediate structures. FIG. 5B is a graph illustrating different levels of sheet resistance for each type of intermediate structures.

Referring to FIG. 5A, the contact resistance, which is labeled as "Rc," is approximately 20 times lower when implementing a Ti/WN$_x$/TiN$_x$/WSi$_x$/WN$_x$ intermediate structure to a gate structure than when implementing a WSi$_x$/WN$_x$ intermediate structure. Referring to FIG. 5B, the sheet resistance associated with the Ti/WN$_x$/TiN$_x$/WSi$_x$/WN$_x$ intermediate structure is substantially the same as that of the WSi$_x$/WN$_x$ intermediate structure, and is approximately ⅓ lower than that of a WSi$_x$/polysilicon gate structure. Herein, x representing a corresponding atomic ratio is a positive number. In particular, x in the WSi$_x$ layer may range between approximately 2 and 5 (more specifically between approximately 2 and 3). Also, the WSi$_x$ layer is in an amorphous state.

For instance, in the Ti/WN$_x$/TiN$_x$/WSi$_x$/WN$_x$ intermediate structure, if the Ti, WN$_x$, TiN$_x$, WSi$_x$, and WN$_x$ layers were formed to respective thicknesses of approximately 30 Å, 50 Å, 40 Å, 60 Å, and 50 Å, and the tungsten electrode was approximately 400 Å thick, a contact resistance and a sheet resistance were approximately 3×10$^{-7}$ ohm(Ω)-cm$^2$ or less, and approximately 4.5 Ω/square(sq.), respectively. Also, a polysilicon depletion ratio (PDR) was measured at approximately 69%. In general, if the PDR is approximately 65% or more, the test result is determined as "good."

When implementing the WSi$_x$/WN$_x$ intermediate structure as a comparative intermediate structure to the Ti/WN$_x$/TiN$_x$/WSi$_x$/WN$_x$ intermediate structure, the measured sheet resistance and a PDR were approximately 4.5 Ω/sq. and 72%, respectively. Thus, the test result was determined as "good." However, a high contact resistance was observed. The measured contact resistance was approximately 3×10$^{-6}$ Ω-cm$^2$.

For a Ti/WN$_x$ or TiN$_x$/WN$_x$ intermediate structure, the measured PDR and contact resistance was approximately 71% and 3×10$^{-7}$ Ω-cm$^2$, respectively. This measurement indicates the test result was determined as "good." However, a high sheet resistance was observed. The measured sheet resistance was approximately 11 Ω/sq. In the case of the Ti/WN$_x$/TiN$_x$/WSi$_x$/WN$_x$ intermediate structure, due to the WSi$_x$ layer, a low sheet resistance was observed. For instance, the measured sheet resistance was approximately 4.5 Ω/sq., which is nearly the same as the sheet resistance obtained when implementing the WSi$_x$/WN$_x$ intermediate structure.

As shown in FIGS. 5A and 5B, a gate structure including the Ti/WN$_x$/TiN$_x$/WSi$_x$/WN$_x$ intermediate structure according to the embodiment of the present invention has a contact resistance and a sheet resistance that can be simultaneously lowered as compared to those of the conventional gate structure. As a result, the gate structure including the Ti/WN$_x$/TiN$_x$/WSi$_x$/WN$_x$ intermediate structure can be suitably applied to high-speed devices. Also, the implementation of the Ti/WN$_x$/TiN$_x$/WSi$_x$/WN$_x$ intermediate structure in the gate structure allows an increase in PDR.

In particular, the embodiments of the present invention introduce the gate structure implemented in the PMOS device, which includes the Ti/WN$_x$/TiN$_x$/WSi$_x$/WN$_x$ intermediate structure disposed between one electrode (e.g., the P-type impurity doped polysilicon electrode) and another electrode (e.g., W electrode). However, the Ti/WN$_x$/TiN$_x$/WSi$_x$/WN$_x$ intermediate structure can also be applied to a gate structure implemented in an NMOS device by being disposed between one electrode and another electrode. A polysilicon electrode doped with an N-type impurity (e.g., P) is one exemplary electrode, and the other electrode may include a metal such as tungsten. In detail, the polysilicon electrode is divided into an N-type impurity doped portion and a P-type impurity doped portion, and patterned thereafter, so as to be applied to CMOS devices including dual polysilicon-based gate structures.

While the present invention has been described with respect to illustrative embodiments, it will be apparent to those skilled in the art that various changes and modifications may be made without departing from the spirit and scope of the invention as defined in the following claims.

What is claimed is:

1. A method for forming a gate structure of a semiconductor device, the method comprising:
    forming a first electrode proximate to an upper surface of a substrate;
    forming an intermediate structure over the first electrode, wherein forming the intermediate structure comprises:
        forming a titanium layer, a first tungsten nitride layer and a titanium nitride layer over the first electrode, and
        forming a tungsten silicide layer and a second tungsten nitride layer over the titanium nitride layer; and
    forming a second electrode over the intermediate structure.

2. The method of claim 1, wherein forming the intermediate structure comprises performing one of a chemical vapor deposition (CVD) method, an atomic layer deposition (ALD) method, and a physical vapor deposition (PVD) method.

3. The method of claim 1, wherein the tungsten silicide (WSi$_x$) layer has an atomic ratio of silicon to tungsten in a range of approximately 2 to 5.

4. The method of claim 1, wherein the tungsten silicide layer is in an amorphous state.

5. The method of claim 1, wherein the tungsten silicide layer is formed by performing one of a chemical vapor deposition (CVD) method and a physical vapor deposition (PVD) method, and the titanium layer, the first tungsten nitride layer, the titanium nitride layer, and the second tungsten nitride layer are formed by performing a PVD method.

6. The method of claim 1, wherein the titanium layer is formed to a thickness of approximately 50 Å or less.

7. The method of claim 6, wherein the titanium layer is formed to a thickness of approximately 5 Å to 30 Å.

8. The method of claim 1, wherein the titanium nitride layer is formed to a thickness of approximately 20 Å or more.

9. The method of claim 8, wherein the titanium nitride layer is formed to a thickness of approximately 40 Å to 200 Å.

10. The method of claim 1, wherein the first and second tungsten nitride layers each are formed to a thickness ranging from approximately 50 Å to 100 Å.

11. The method of claim 1, wherein the first and second tungsten nitride layers each have a nitrogen content of approximately 10% to 50%.

12. The method of claim 1, wherein the tungsten silicide layer is formed to a thickness ranging from approximately 40 Å to 100 Å.

13. The method of claim 1, wherein the first electrode comprises a polysilicon layer doped with P-type dopants, the P-type dopants comprising boron.

14. The method of claim 1, wherein the second electrode comprises a metal layer, the metal layer comprising tungsten.

15. The method of claim 1, wherein the gate structure is formed in a dual gate structure in which the first electrode comprises a polysilicon layer divided into an N-type impurity doped portion and a P-type impurity doped portion.

16. The method of claim 1, wherein the first electrode comprises a polysilicon layer, the titanium layer, the first tungsten nitride layer, the titanium nitride layer, the tungsten silicide layer, and the second tungsten nitride layer being thermally treated to obtain a titanium silicide layer over the polysilicon layer, a first titanium nitride layer over the titanium silicide layer, a tungsten layer over the first titanium nitride layer, a second titanium nitride layer over the tungsten layer, a tungsten silicide layer over the second titanium nitride layer, and a tungsten silicon nitride layer over the tungsten silicide layer, wherein the titanium silicide layer has an atomic ratio of silicide to the titanium being approximately 2.

\* \* \* \* \*